(12) United States Patent
Sung et al.

(10) Patent No.: US 10,553,567 B2
(45) Date of Patent: Feb. 4, 2020

(54) CHIP STACK PACKAGES

(71) Applicant: SK hynix Inc., Icheon-si, Gyeonggi-do (KR)

(72) Inventors: Ki Jun Sung, Cheongju-si (KR); Ki Bum Kim, Icheon-si (KR)

(73) Assignee: SK hynix Inc., Icheon-si, Gyeonggi-do (KR)

(*) Notice: Subject to any disclaimer, the term of this patent is extended or adjusted under 35 U.S.C. 154(b) by 0 days.

(21) Appl. No.: 16/183,590

(22) Filed: Nov. 7, 2018

(65) Prior Publication Data

US 2019/0319009 A1 Oct. 17, 2019

(30) Foreign Application Priority Data

Apr. 12, 2018 (KR) .................. 10-2018-0042961

(51) Int. Cl.
*H01L 25/065* (2006.01)
*H01L 23/00* (2006.01)
*H01L 23/528* (2006.01)

(52) U.S. Cl.
CPC ........ *H01L 25/0657* (2013.01); *H01L 23/528* (2013.01); *H01L 24/24* (2013.01); *H01L 24/32* (2013.01); *H01L 24/73* (2013.01); *H01L 2224/244* (2013.01); *H01L 2224/24145* (2013.01); *H01L 2224/2518* (2013.01); *H01L 2224/25171* (2013.01); *H01L 2224/32145* (2013.01); *H01L 2224/73267* (2013.01); *H01L 2225/06513* (2013.01)

(58) Field of Classification Search
CPC ..... H01L 25/0657; H01L 24/73; H01L 24/32; H01L 23/528
See application file for complete search history.

(56) References Cited

U.S. PATENT DOCUMENTS

2011/0193086 A1* 8/2011 Lee .................. G11C 5/025
257/48

FOREIGN PATENT DOCUMENTS

KR          10273275 B1    12/2000
KR       1020060070843 A    6/2006
KR       1020110045222 A    5/2011

* cited by examiner

*Primary Examiner* — Joseph C. Nicely
(74) *Attorney, Agent, or Firm* — William Park & Associates Ltd.

(57) ABSTRACT

A chip stack package includes first and second semiconductor chips. A first redistribution line structure is disposed on a front surface of the first semiconductor chip, and the first redistribution line structure extends onto a side surface of the first semiconductor chip. A second redistribution line structure is disposed on the front surface of the first semiconductor chip, and the second redistribution line structure extends onto the side surface of the first semiconductor chip. A third redistribution line structure is disposed on a front surface of the second semiconductor chip, and the third redistribution line structure extends onto a side surface of the second semiconductor chip to be electrically connected to the second redistribution line structure.

20 Claims, 11 Drawing Sheets

CHIP STACK PACKAGES

CROSS-REFERENCE TO RELATED APPLICATIONS

The present application claims priority under 35 U.S.C 119(a) to Korean Application No. 10-2018-0042961, filed on Apr. 12, 2018, which is incorporated herein by references in its entirety.

BACKGROUND

1. Technical Field

Various embodiments of the present disclosure generally relate to semiconductor package technologies and, more particularly, to chip stack packages.

2. Related Art

Recently, semiconductor packages having a high density and a high performance have been required in various electronic systems. In addition, the semiconductor packages have been developed to have a structure of a relatively small form factor. In response to such a demand, a lot of effort has been focused on improving a flip chip stack technique which is used in fabrication of chip stack packages. The chip stack packages may be realized by vertically stacking a plurality of semiconductor chips.

SUMMARY

According to an embodiment, a chip stack package includes a first semiconductor chip and a second semiconductor chip. The first semiconductor chip may have a first surface and a second surface being opposite to each other and also may have a first side surface connecting edges of the first surface to edges of the second surface. The second semiconductor chip may have a third surface and a fourth surface being opposite to each other and also may have a second side surface connecting edges of the third surface to edges of the fourth surface. The second semiconductor chip may be stacked on the second surface of the first semiconductor chip. A first redistribution line structure may be disposed on the first surface. The first redistribution line structure may extend onto the first side surface. A second redistribution line structure may be disposed on the first surface. The second redistribution line structure may extend onto the first side surface. A third redistribution line structure may be disposed on the third surface. The third redistribution line structure may extend onto the second side surface to be electrically connected to the second redistribution line structure.

According to another embodiment, a chip stack package includes a pair of sub-stack structures which are vertically stacked. Each of the pair of sub-stack structures includes a first semiconductor chip and a second semiconductor chip. The first semiconductor chip may have a first surface and a second surface being opposite to each other and also may have a first side surface connecting edges of the first surface to edges of the second surface. The second semiconductor chip may have a third surface and a fourth surface being opposite to each other and also may have a second side surface connecting edges of the third surface to edges of the fourth surface. The second semiconductor chip may be stacked on the second surface of the first semiconductor chip. A first redistribution line structure may be disposed on the first surface. The first redistribution line structure may extend onto the first side surface. A second redistribution line structure may be disposed on the first surface. The second redistribution line structure may extend onto the first side surface. A third redistribution line structure may be disposed on the third surface. The third redistribution line structure may extend onto the second side surface to be electrically connected to the second redistribution line structure. A fourth redistribution line structure may be disposed on the third surface. The fourth redistribution line structure may extend onto the second side surface to be electrically connected to the first redistribution line structure. The pair of sub-stack structures may be vertically stacked such that the third surface of the second semiconductor chip included in one of the pair of sub-stack structures faces the first surface of the first semiconductor chip included in the other of the pair of sub-stack structures.

DETAILED DESCRIPTION

Figure 1:
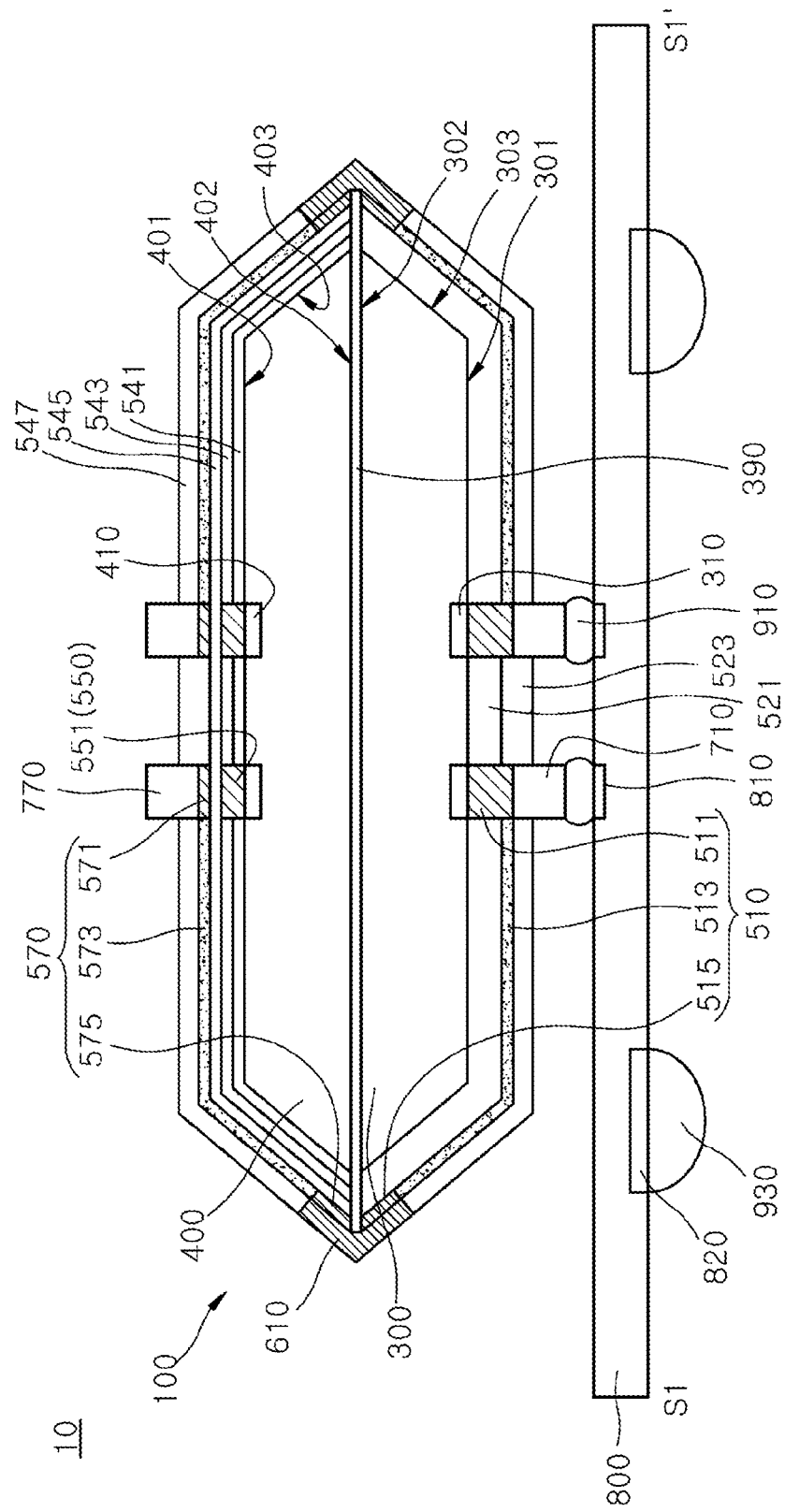
FIGS. 1 to 3 are cross-sectional views illustrating a chip stack package according to an embodiment.

The terms used herein may correspond to words selected in consideration of their functions in embodiments of the present disclosure and the meanings of the terms may be construed to be different according to ordinary skill in the art to which embodiments of the present disclosure belong. If defined in detail, the terms may be construed according to the definitions. Unless otherwise defined, the terms (including technical and scientific terms) used herein have the same meaning as commonly understood by one of ordinary skill in the art to which embodiments of the present disclosure belong.

It will be understood that although the terms "first," "second," "third," etc. may be used herein to describe various elements, these elements should not be limited by these terms. These terms are only used to distinguish one element from another element, but not used to define only the element itself or to mean a particular sequence.

It will also be understood that when an element or layer is referred to as being "on," "over," "below," "under," or "outside" another element or layer, the element or layer may be in direct contact with the other element or layer, or intervening elements or layers may be present. Other words used to describe the relationship between elements or layers should be interpreted in a like fashion (e.g., "between" versus "directly between" or "adjacent" versus "directly adjacent").

Spatially relative terms, such as "beneath," "below," "lower," "above," "upper," "top," "bottom" and the like, may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, when the device in the figures is turned over, elements described as below and/or beneath other elements or features would then be oriented above the other elements or features. The device may be otherwise oriented (rotated 90 degrees or at other orientations) and the spatially relative descriptors used herein interpreted accordingly.

A semiconductor package may include electronic devices such as semiconductor chips or semiconductor dies. The semiconductor chips or the semiconductor dies may be obtained by separating a semiconductor substrate such as a wafer into a plurality of pieces using a die sawing process. The semiconductor chips may correspond to memory chips, logic chips (including application specific integrated circuits (ASIC) chips), or system-on-chips (SoC). The memory chips may include dynamic random access memory (DRAM) circuits, static random access memory (SRAM) circuits, NAND-type flash memory circuits, NOR-type flash memory circuits, magnetic random access memory (MRAM) circuits, resistive random access memory (ReRAM) circuits, ferroelectric random access memory (FeRAM) circuits or phase change random access memory (PcRAM) circuits which are integrated on the semiconductor substrate. The logic chips may include logic circuits which are integrated on the semiconductor substrate. The semiconductor package may be employed in communication systems such as mobile phones, electronic systems associated with biotechnology or health care, or wearable electronic systems.

Same reference numerals refer to same elements throughout the specification. Even though a reference numeral is not mentioned or described with reference to a drawing, the reference numeral may be mentioned or described with reference to another drawing. In addition, even though a reference numeral is not shown in a drawing, it may be mentioned or described with reference to another drawing.

Various embodiments of the present disclosure may provide chip stack packages including electrical interconnection paths formed using redistribution line structures.

Figure 2:
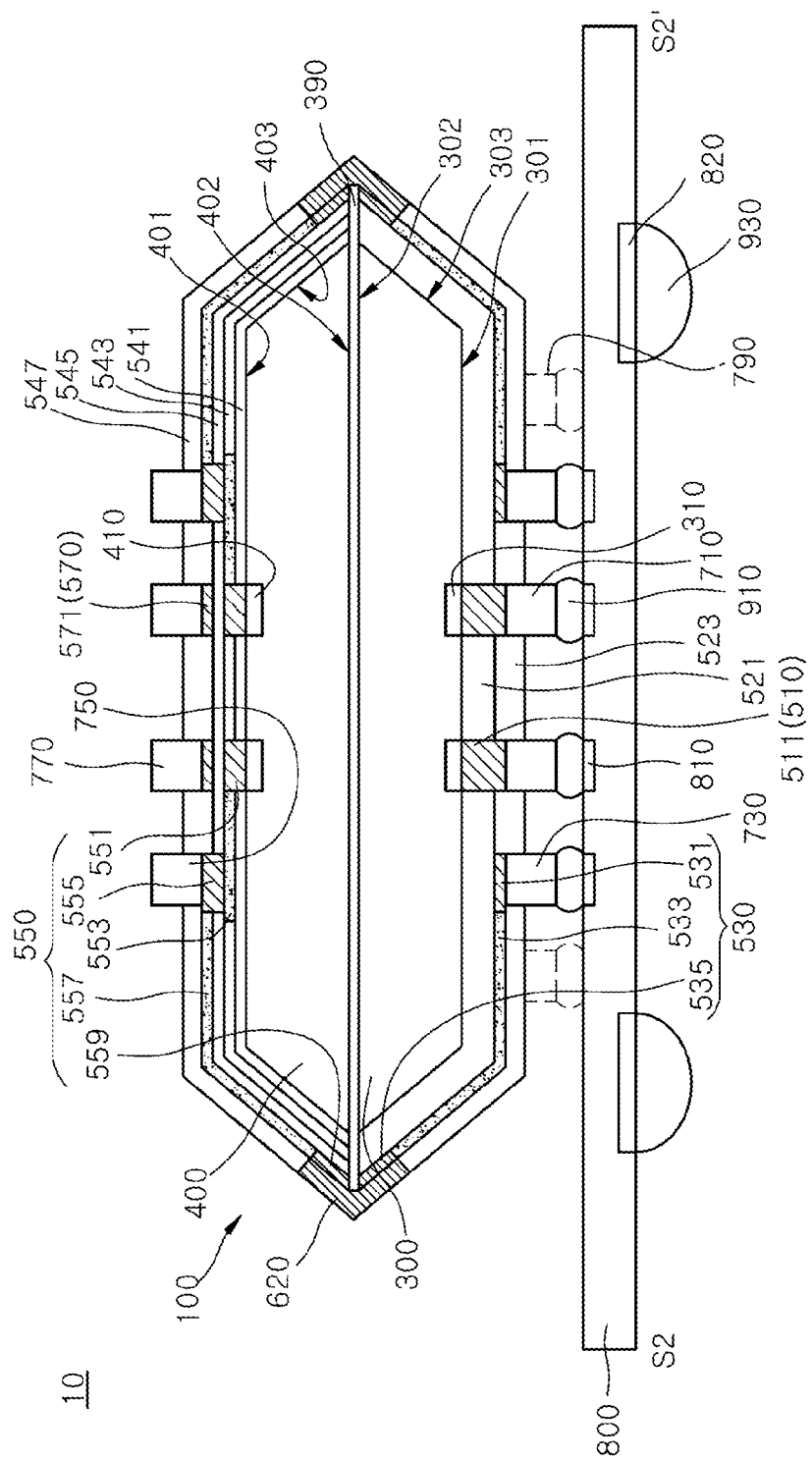
Figure 3:
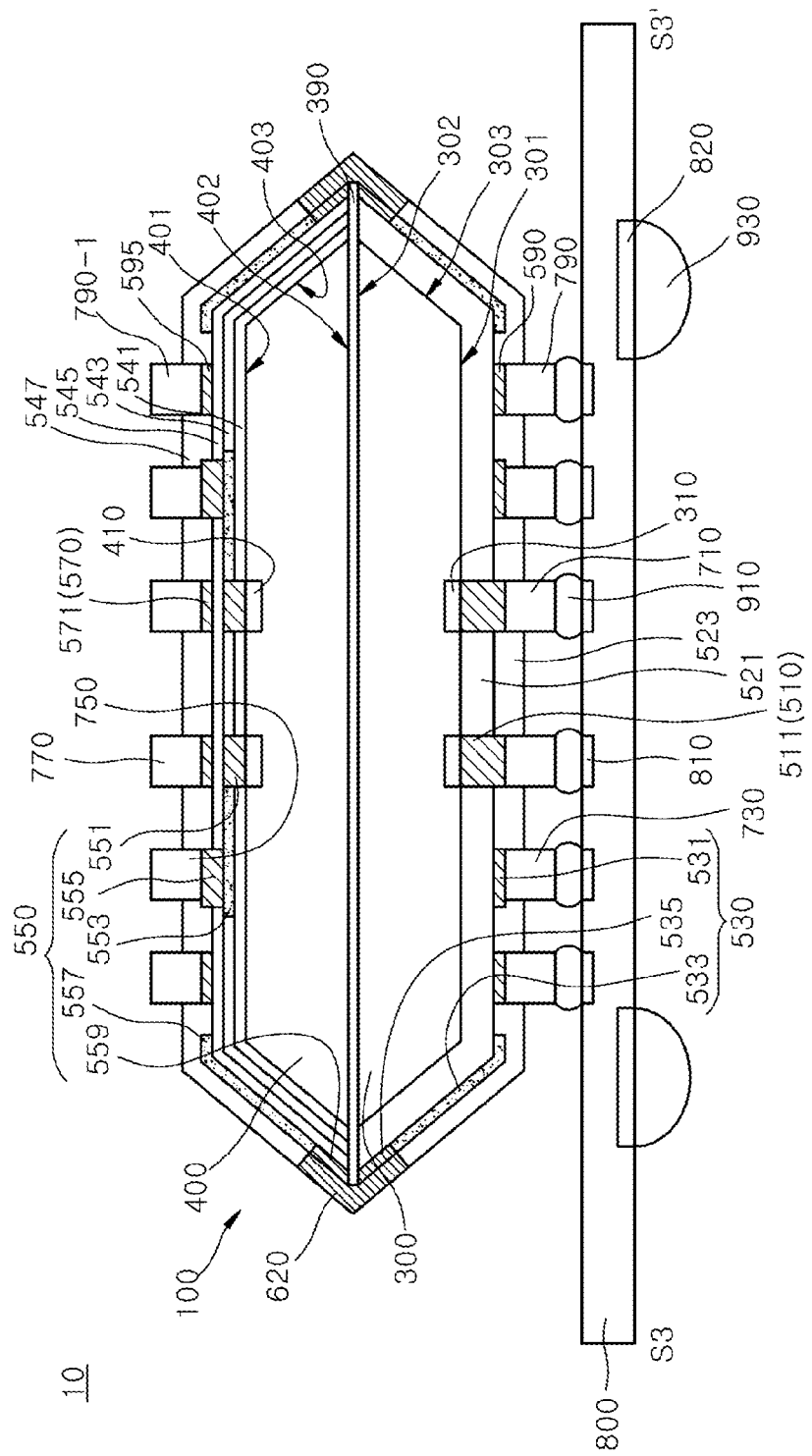
Figure 4:
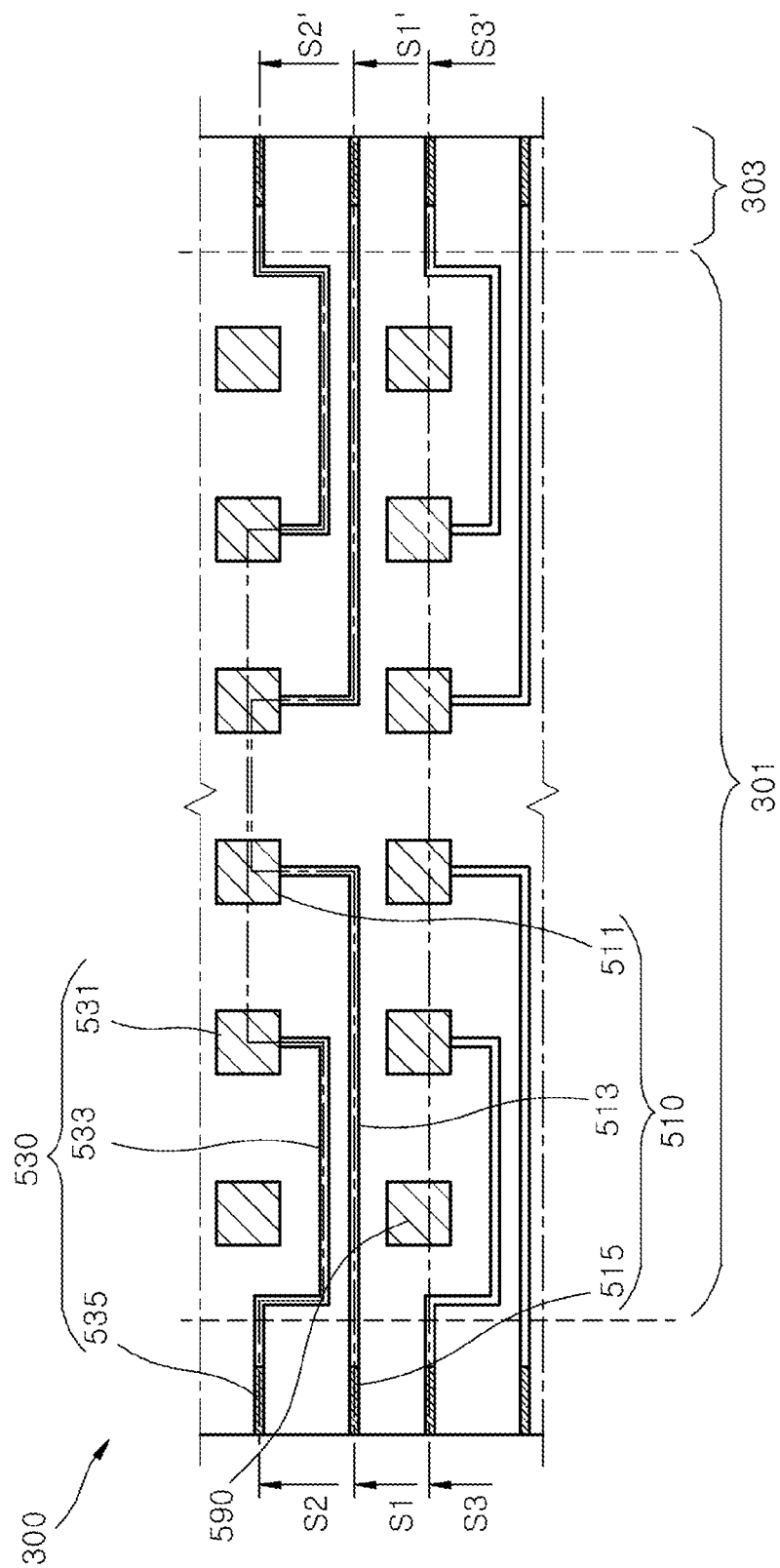
FIG. 4 is a schematic view illustrating redistribution line structures disposed on a first semiconductor chip of a chip stack package according to an embodiment.
Figure 5:
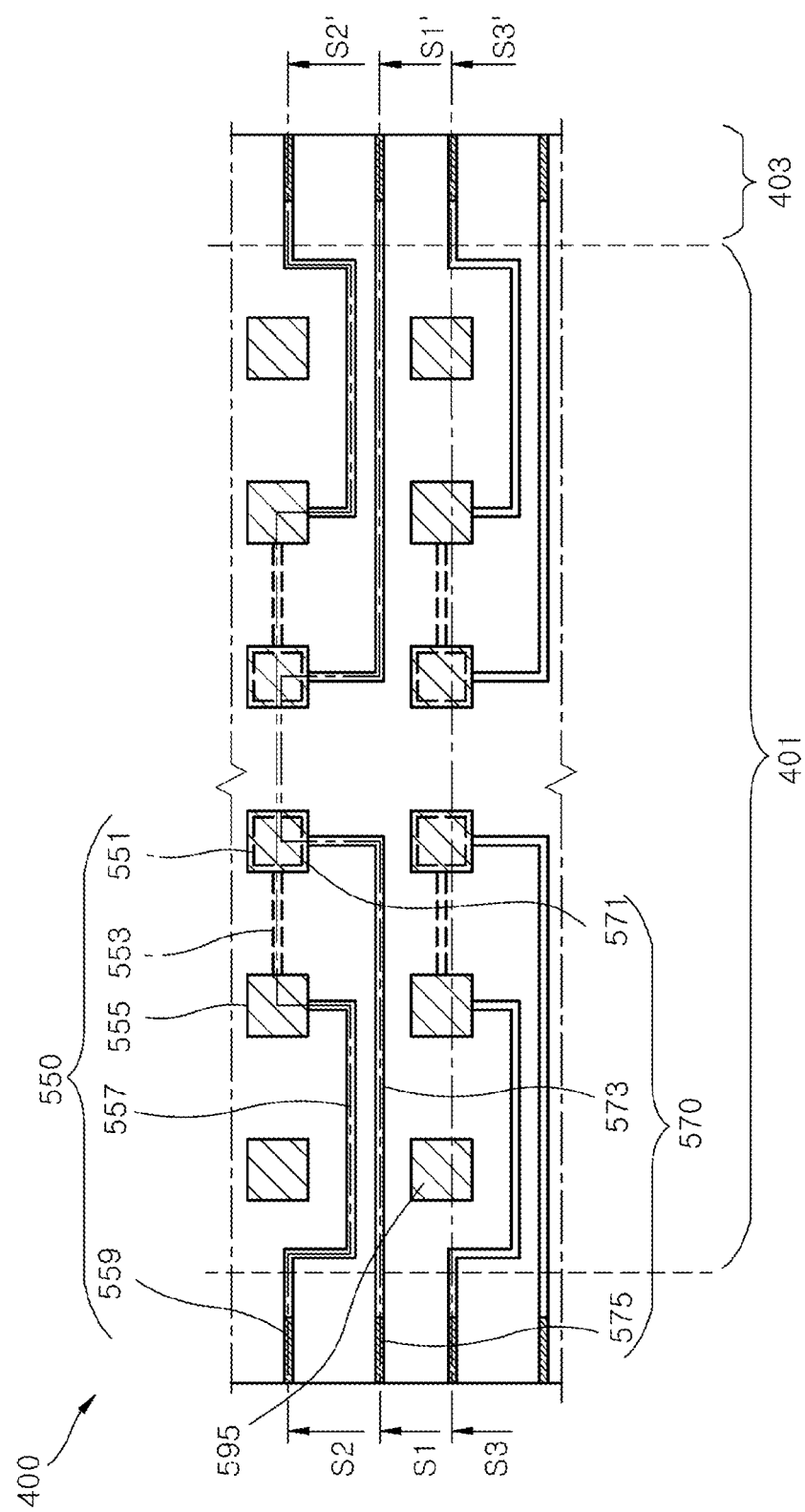
FIG. 5 is a schematic view illustrating redistribution line structures disposed on a second semiconductor chip of a chip stack package according to an embodiment.
Figure 6:
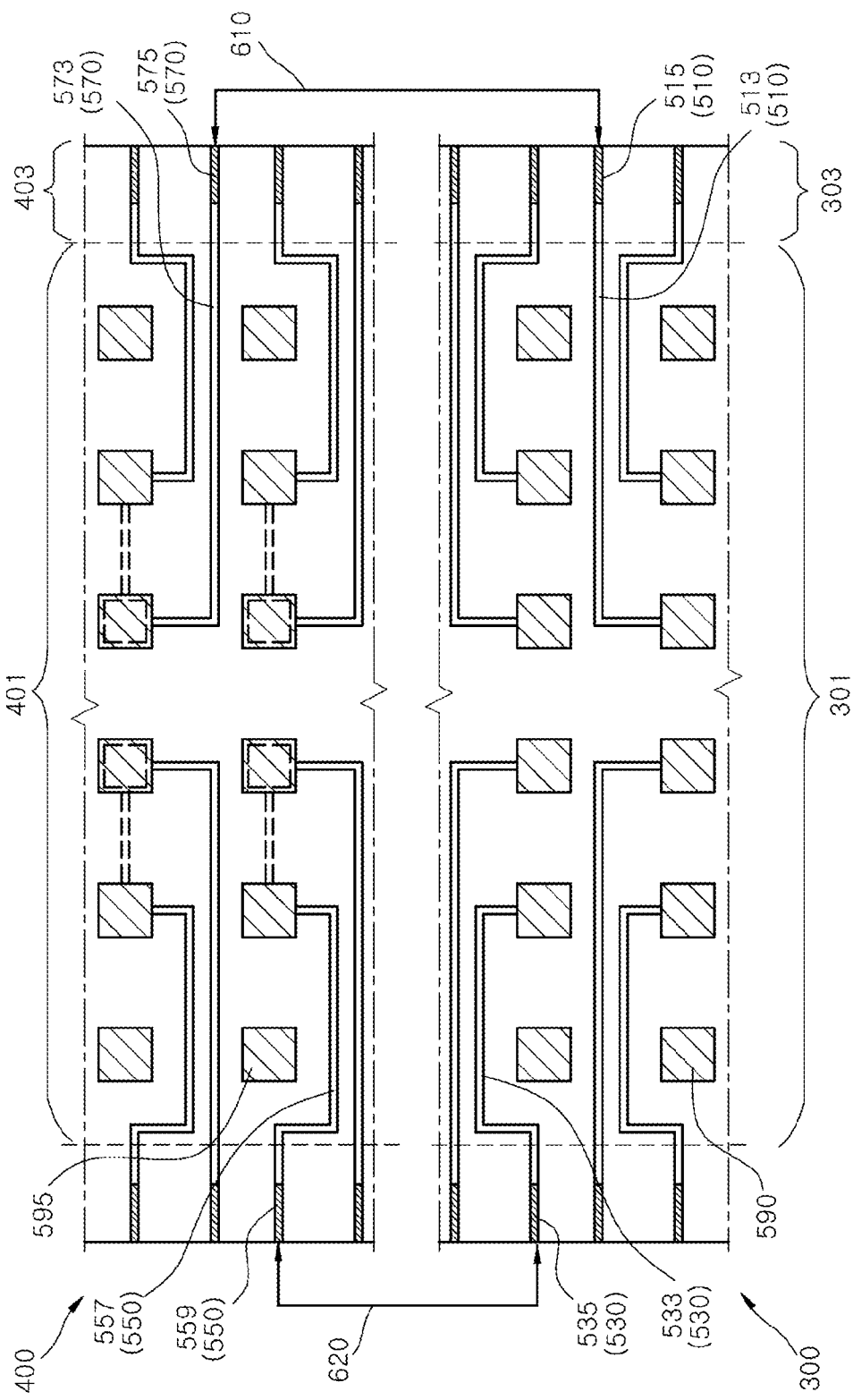
FIG. 6 is a schematic view illustrating redistribution line structures disposed in a chip stack package according to an embodiment.

FIGS. 1 to 3 are cross-sectional views illustrating a chip stack package 10 according to an embodiment. FIG. 4 is an enlarged view illustrating a portion of a planar layout of first and second redistribution line structures 510 and 530 disposed on a first semiconductor chip 300 of the chip stack package 10, and FIG. 5 is an enlarged view illustrating a portion of a planar layout of third and fourth redistribution line structures 550 and 570 disposed on a second semiconductor chip 400 of the chip stack package 10. FIG. 1 is a cross-sectional view taken along a line S1-S1' of FIGS. 4 and 5, and FIG. 2 is a cross-sectional view taken along a line S2-S2' of FIGS. 4 and 5. FIG. 3 is a cross-sectional view taken along a line S3-S3' of FIGS. 4 and 5. FIG. 6 is a planar layout of the first to fourth redistribution line structures 510, 530, 550, and 570 disposed in the chip stack package 10.

Referring to FIG. 1, the chip stack package 10 may include a sub-stack structure 100 comprised of the first semiconductor chip 300 and the second semiconductor chip 400 which are vertically stacked. The sub-stack structure 100 may correspond to one structure unit comprised of the first and second semiconductor chips 300 and 400 which are stacked. Although FIG. 1 illustrates an example in which the first semiconductor chip 300 is disposed below the second semiconductor chip 400, the present disclosure may not be limited thereto. For example, in some other embodiment, the sub-stack structure 100 may be flipped such that the first semiconductor chip 300 is disposed on the second semiconductor chip 400. The first and second semiconductor chips 300 and 400 may have the same function. The first and second semiconductor chips 300 and 400 may be memory chips.

The first semiconductor chip 300 may have first and second surfaces 301 and 302 which are opposite to each other. Integrated circuits of the first semiconductor chip 300 may be disposed to be adjacent to the first surface 301 corresponding to an active surface (e.g., a front surface) of the first semiconductor chip 300. First chip pads 310 may be disposed on the first surface 301. The first chip pads 310 may act as interconnection members that electrically connect the integration circuits of the first semiconductor chip 300 to an external device or an external system. The first chip pads 310 may be center pads which are disposed on a central region of the first surface 301. The second surface 302 of the first semiconductor chip 300 may correspond to a back surface of the first semiconductor chip 300. The first semiconductor chip 300 may also have a first side surface 303 that connects edges of the first surface 301 to edges of the second surface 302. The first side surface 303 may be an inclined surface having a positive slope. In a slope of the first side surface 303, the positive slope means that a diameter of a width of the first surface 301 corresponding to the front surface of the first semiconductor chip 300 is less than a diameter of a width of the second surface 302 corresponding to the back surface of the first semiconductor chip 300. In some embodiments, a slope of the first side surface 303, the positive slope means that a length of a width of the first surface 301 corresponding to the front surface of the first semiconductor chip 300 is less than a length of a width of the second surface 302 corresponding to the back surface of the first semiconductor chip 300. In other embodiments, the first side surface 303 may be an inclined surface having a negative slope. For example, in a slope of the first side surface 303, the negative slope means that a length of a width of the first surface 301 corresponding to the front surface of the first semiconductor chip 300 is greater than a length of a width of the second surface 302 corresponding to the back surface of the first semiconductor chip 300.

The second semiconductor chip 400 may have third and fourth surfaces 401 and 402 which are opposite to each other. Integrated circuits of the second semiconductor chip 400 may be disposed to be adjacent to the third surface 401 corresponding to an active surface (e.g., a front surface) of the second semiconductor chip 400. Second chip pads 410 may be disposed on the third surface 401. The second chip pads 410 may act as interconnection members that electrically connect the integration circuits of the second semiconductor chip 400 to an external device or an external system. The second chip pads 410 may be center pads which are disposed on a central region of the third surface 401. The fourth surface 402 of the second semiconductor chip 400 may correspond to a back surface of the second semiconductor chip 400. The second semiconductor chip 400 may also have a second side surface 403 that connects edges of the third surface 401 to edges of the fourth surface 402. The second side surface 403 may be an inclined surface having a positive slope. In a slope of the second side surface 403, the positive slope means that a diameter of a width of the third surface 401 corresponding to the front surface of the second semiconductor chip 400 is less than a diameter of a width of the fourth surface 402 corresponding to the back surface of the second semiconductor chip 400. In some embodiments, a slope of the second side surface 403, the positive slope means that a length of a width of the third surface 401 corresponding to the front surface of the second semiconductor chip 400 is less than a length of a width of the fourth surface 402 corresponding to the back surface of the second semiconductor chip 400. In other embodiments, the second side surface 403 may be an inclined surface having a negative slope. For example, in a slope of the second side surface 403, the negative slope means that a length of a width of the third surface 401 corresponding to the front surface of the second semiconductor chip 400 is greater than a length of a width of the fourth surface 402 corresponding to the back surface of the second semiconductor chip 400.

The second semiconductor chip 400 may be attached to the first semiconductor chip 300 by an adhesive layer 390. The adhesive layer 390 may be disposed between the fourth surface 402 of the second semiconductor chip 400 and the second surface 302 of the first semiconductor chip 300. That is, the adhesive layer 390 may bond the fourth surface 402 of the second semiconductor chip 400 to the second surface 302 of the first semiconductor chip 300. The third surface 401 of the second semiconductor chip 400 may correspond to a top surface of the sub-stack structure 100, and the first surface 301 of the first semiconductor chip 300 may correspond to a bottom surface of the sub-stack structure 100. The adhesive layer 390 may include an adhesive material such as an epoxy resin material.

Referring to FIGS. 1 and 4, the first redistribution line structure 510 may be disposed on the first semiconductor chip 300 of the sub-stack structure 100. The first redistribution line structure 510 may be a conductive pattern which is electrically connected to the first semiconductor chip 300 through any one of the first chip pads 310. The first redistribution line structure 510 may be disposed on the first surface 301 of the first semiconductor chip 300 and may extend onto the first side surface 303 of the first semiconductor chip 300. The first redistribution line structure 510 may extend onto the first side surface 303 to reach an edge of the second surface 302.

Referring to FIGS. 2 and 4, the second redistribution line structure 530 may be disposed on the first semiconductor chip 300 of the sub-stack structure 100. The second redistribution line structure 530 may be a conductive pattern that electrically bypasses the first semiconductor chip 300. The second redistribution line structure 530 may be a conductive pattern which is electrically disconnected from the first semiconductor chip 300. The second redistribution line structure 530 may be electrically disconnected from the first chip pads 310. That is, the second redistribution line structure 530 may be electrically isolated from the first chip pads 310. As illustrated in FIG. 4, the second redistribution line structure 530 may be distinct from the first redistribution line structure 510 and may be spaced apart from the first redistribution line structure 510. That is, the second redistribution line structure 530 may be a conductive pattern which is electrically isolated from the first redistribution line structure 510. The second redistribution line structure 530 and the first redistribution line structure 510 may be alternately and repeatedly disposed on the first semiconductor chip 300. The second redistribution line structure 530 may be disposed on both of the first surface 301 and the first side surface 303. The second redistribution line structure 530 may be located on a portion of the first surface 301 of the first semiconductor chip 300 and may extend onto the first side surface 303 of the first semiconductor chip 300. The second redistribution line structure 530 may extend onto the first side surface 303 to reach an edge of the second surface 302.

Referring to FIGS. 2 and 5, the third redistribution line structure 550 may be disposed on the second semiconductor chip 400 of the sub-stack structure 100. The third redistribution line structure 550 may be a conductive pattern which is electrically connected to the second semiconductor chip 400 through any one of the second chip pads 410. The third redistribution line structure 550 may be disposed on the third surface 401 of the second semiconductor chip 400 and may extend onto the second side surface 403 of the second semiconductor chip 400. The third redistribution line structure 550 may extend onto the second side surface 403 to reach an edge of the fourth surface 402.

Referring to FIGS. 1 and 5, the sub-stack structure 100 may include the fourth redistribution line structure 570 which is disposed on the second semiconductor chip 400. The fourth redistribution line structure 570 may be a conductive pattern that electrically bypasses the second semiconductor chip 400. The fourth redistribution line structure 570 may be a conductive pattern which is electrically disconnected from the second semiconductor chip 400. The fourth redistribution line structure 570 may be electrically disconnected from the second chip pads 410. That is, the fourth redistribution line structure 570 may be electrically isolated from the second chip pads 410. As illustrated in FIG. 5, the fourth redistribution line structure 570 may be distinct from the third redistribution line structure 550 and may be spaced apart from the third redistribution line structure 550. That is, the fourth redistribution line structure 570 may be a conductive pattern which is electrically isolated from the third redistribution line structure 550. The fourth redistribution line structure 570 and the third redistribution line structure 550 may be alternately and repeatedly disposed on the second semiconductor chip 400. The fourth redistribution line structure 570 may be disposed on both of the third surface 401 and the second side surface 403. The fourth redistribution line structure 570 may be located on a portion of the third surface 401 of the second semiconductor chip 400 and may extend onto the second side surface 403 of the second semiconductor chip 400. The fourth redistribution line structure 570 may extend onto the second side surface 403 to reach an edge of the fourth surface 402.

Referring to FIGS. 2 and 6, the third redistribution line structure 550 may be electrically connected to the second redistribution line structure 530. The third redistribution line structure 550 and the second redistribution line structure 530 may be electrically connected to each other by a second side connector 620. The second side connector 620 may include a solder layer. The second side connector 620 may extend to cover an end portion 559 of a third extending portion 557 of the third redistribution line structure 550 and an end portion 535 of a second extending portion 533 of the second redistribution line structure 530. The second side connector 620 may have a shape of a wedge that laterally protrudes to be sharp.

Referring to FIGS. 1 and 6, the fourth redistribution line structure 570 may be electrically connected to the first redistribution line structure 510. The fourth redistribution line structure 570 and the first redistribution line structure 510 may be electrically connected to each other by a first side connector 610. The first side connector 610 may be spaced apart from the second side connector (620 of FIG. 2) and may be electrically isolated from the second side connector 620. The first side connector 610 may have substantially the same shape as the second side connector 620. The first side connector 610 may include the same material as the second side connector 620. The first side connector 610 may extend to cover an end portion 575 of a fourth extending portion 573 of the fourth redistribution line structure 570 and an end portion 515 of a first extending portion 513 of the first redistribution line structure 510. The first side connector 610 may have a shape of a wedge that laterally protrudes to be sharp.

Referring to FIGS. 1 and 4, the first redistribution line structure 510 may be a conductive pattern including a first landing portion 511 and the first extending portion 513. The first extending portion 513 may include the end portion 515 thereof. The first landing portion 511 may be disposed on the first surface 301 of the first semiconductor chip 300 to overlap with and be in contact with any one of the first chip pads 310. The first landing portion 511 of the first redistribution line structure 510 may directly contact any one of the first chip pads 310. The first extending portion 513 of the first redistribution line structure 510 may be a portion that extends from the first landing portion 511 onto the first side surface 303. The end portion 515 of the first extending portion 513 may overlap with the first side connector 610 and may be in direct contact with the first side connector 610.

A first dielectric layer 521 may be disposed between the first surface 301 and the first redistribution line structure 510 as well as between the first side surface 303 and the first redistribution line structure 510. The first extending portion 513 (including the end portion 515) of the first redistribution line structure 510 may be isolated from the first surface 301 and the first side surface 303 by the first dielectric layer 521. The first landing portion 511 may substantially penetrate the first dielectric layer 521 to contact any one of the first chip pads 310. A second dielectric layer 523 may be stacked on the first dielectric layer 521. The second dielectric layer 523 may extend to cover the first redistribution line structure 510. The second dielectric layer 523 may be a dielectric layer that covers the first extending portion 513 of the first redistribution line structure 510 and reveals the end portion 515 and the first landing portions 511.

Referring to FIGS. 2 and 4, the second redistribution line structure 530 may be a conductive pattern including a second landing portion 531 and the second extending portion 533. The second extending portion 533 may include the end portion 535 thereof. The second landing portion 531 of the second redistribution line structure 530 may be disposed to be laterally spaced apart from the first landing portion 511 of the first redistribution line structure 510. The second redistribution line structure 530 may electrically bypass the first semiconductor chip 300. The second landing portion 531 of the second redistribution line structure 530 may be electrically disconnected from the first chip pads 310 of the first semiconductor chip 300. The second extending portion 533 of the second redistribution line structure 530 may extend from the second landing portion 531 disposed over the first surface 301 of the first semiconductor chip 300 onto the first side surface 303. The end portion 535 of the second extending portion 533 may be in contact with and overlap with the second side connector 620. The first dielectric layer 521 may extend into an interface between the second redistribution line structure 530 and the first semiconductor chip 300, and the second dielectric layer 523 may extend to cover the second extending portion 533 of the second redistribution line structure 530.

Referring to FIGS. 2 and 5, the third redistribution line structure 550 may be a conductive pattern including a third landing portion 551, an interconnecting portion 553, a fourth landing portion 555, and the third extending portion 557. The third extending portion 557 may include the end portion 559 thereof. The third extending portion 551 may be disposed on the third surface 401 of the first semiconductor chip 300 to overlap with and be in contact with any one of the second chip pads 410. The third landing portion 551 of the third redistribution line structure 550 may directly contact any one of the second chip pads 410. The fourth landing portion 555 may be disposed to be laterally spaced apart from the third landing portion 551, The interconnecting portion 553 may extend from the third landing portion 551 to electrically connect the third landing portion 551 to the fourth landing portion 555. The third extending portion 557 of the third redistribution line structure 550 may be a portion that extends from the fourth landing portion 555 disposed over the third surface 401 onto the second side surface 403. The end portion 559 of the third extending portion 557 may overlap with the second side connector 620 and may be in direct contact with the second side connector 620.

A third dielectric layer 541 may be disposed between the third surface 401 and the third redistribution line structure 550 as well as between the second side surface 403 and the third redistribution line structure 550. The interconnecting portion 553 of the third redistribution line structure 550 may be electrically isolated from the third surface 401 of the second semiconductor chip 400 by the third dielectric layer 541. A fourth dielectric layer 543 may be disposed on the third dielectric layer 541 to electrically insulate the interconnecting portion 553 from another interconnecting portion adjacent to the interconnecting portion 553. A fifth dielectric layer 545 may be disposed on the fourth dielectric layer 543 to cover the third landing portion 551 and a portion of the interconnecting portion 553. The third extending portion 557 of the third redistribution line structure 550 may be disposed on the fifth dielectric layer 545. The fourth landing portion 555 of the third redistribution line structure 550 may substantially penetrate the fifth dielectric layer 545 to be in contact with the interconnecting portion 553. A sixth dielectric layer 547 may be disposed on the fifth dielectric layer 545 to cover the third extending portion 557 of the third redistribution line structure 550 and to reveal the end portion 559 and the fourth landing portion 555. In an embodiment the fourth dielectric layer 543 and the fifth dielectric layer 545 may not be two separate layers but a single layer.

Referring to FIGS. 1 and 5, the fourth redistribution line structure 570 may be a conductive pattern including a fifth landing portion 571 and the fourth extending portion 573. The fourth extending portion 573 may include the end portion 575 thereof. The fifth landing portion 571 of the fourth redistribution line structure 570 may be disposed to be vertically spaced apart from the third landing portion 551 of the third redistribution line structure 550. The fifth landing portion 571 of the fourth redistribution line structure 570 may be disposed to substantially overlap with the third landing portion 551 of the third redistribution line structure 550 and to substantially overlap with the any one of the second chip pads 410.

The fifth dielectric layer 545 may extend into an interface between the fifth landing portion 571 of the fourth redistribution line structure 570 and the third landing portion 551 of the third redistribution line structure 550. That is, the fifth dielectric layer 545 may be disposed between the fifth landing portion 571 and the third landing portion 551 to electrically insulate the fifth landing portion 571 and the third landing portion 551 from each other. As illustrated in FIGS. 1 and 2, the third landing portion 551 and the interconnecting portion 553 of the third redistribution line structure 550 may be located at a different level from the fifth landing portion 571 and the fourth extending portion 573 of the fourth redistribution line structure 570 as well as the fourth landing portion 555 and the third extending portion 557 of the third redistribution line structure 550.

Referring again to FIG. 1, the fifth landing portion 571 of the fourth redistribution line structure 570 may electrically bypass the second semiconductor chip 400. That is, the fifth landing portion 571 of the fourth redistribution line structure 570 may be electrically disconnected from the second chip pads 410 of the second semiconductor chip 400. The fourth extending portion 573 of the fourth redistribution line structure 570 may extend from the fifth landing portion 571 disposed over the third surface 401 of the second semiconductor chip 400 onto the second side surface 403. The end portion 575 of the fourth extending portion 573 may be in contact with and overlap with the first side connector 610. The sixth dielectric layer 547 may extend to cover the fourth extending portion 573 of the fourth redistribution line structure 570.

Referring to FIG. 1, the sub-stack structure 100 may include first connectors 710 disposed on the first surface 301 of the first semiconductor chip 300. The first connectors 710 may be interconnection members such as copper post bumps. A portion of each of the first connectors 710 may protrude from a surface of the second dielectric layer 523 opposite to the first dielectric layer 521. The first connectors 710 may be attached and bonded to the first landing portions 511 of the first redistribution line structures 510, respectively. The first connectors 710 may be electrically connected to the first semiconductor chip 300 through the first landing portions 511 of the first redistribution line structures 510 and the first chip pads 310 of the first semiconductor chip 300.

Referring to FIG. 2, the sub-stack structure 100 may further include second connectors 730 that are disposed on the first surface 301 of the first semiconductor chip 300 to be distinct from the first connectors 710. A portion of each of the second connectors 730 may protrude from a surface of the second dielectric layer 523 opposite to the first dielectric layer 521. The second connectors 730 may be attached and bonded to the second landing portions 531 of the second redistribution line structures 530, respectively. The second connectors 730 may electrically bypass the first semiconductor chip 300. The second connectors 730 may be electrically connected to the second semiconductor chip 400 through the second redistribution line structures 530, the second side connectors 620, and the third redistribution line structures 550. While the first connectors 710 are electrically connected to the first semiconductor chip 300, the second connectors 730 may be electrically connected to the second semiconductor chip 400.

Referring again to FIG. 2, the sub-stack structure 100 may further include third connectors 750 disposed on the third surface 401 of the second semiconductor chip 400. A portion of each of the third connectors 750 may protrude from a surface of the sixth dielectric layer 547 opposite to the fifth dielectric layer 545. The third connectors 750 may be attached and bonded to the fourth landing portions 555 of the third redistribution line structures 550, respectively. The third connectors 750 may be electrically connected to the second semiconductor chip 400 through the fourth landing portions 555, the interconnecting portions 553, and the third landing portions 551 of the third redistribution line structures 550 as well as the second chip pads 410.

Referring again to FIG. 1, the sub-stack structure 100 may further include fourth connectors 770 that are disposed on the third surface 401 of the second semiconductor chip 400 to be distinct from the third connectors 750. A portion of each of the fourth connectors 770 may protrude from a surface of the sixth dielectric layer 547 opposite to the fifth dielectric layer 545. The fourth connectors 770 may be attached and bonded to the fifth landing portions 571 of the fourth redistribution line structures 570, respectively. The fourth connectors 770 may electrically bypass the second semiconductor chip 400. The fourth connectors 770 may be electrically connected to the first semiconductor chip 300 through the fourth redistribution line structures 570, the first side connectors 610, and the first redistribution line structures 510. While the third connectors 750 are electrically connected to the second semiconductor chip 400, the fourth connectors 770 may be electrically connected to the first semiconductor chip 300.

The third connectors 750 may be electrically connected to the second connectors 730 through electrical paths including the third redistribution line structures 550, the second side connectors 620 and the second redistribution line structures 530. Similarly, the fourth connectors 770 may be electrically connected to the first connectors 710 through electrical paths including the fourth redistribution line structures 570, the first side connectors 610 and the first redistribution line structures 510. In the event that the first and second semiconductor chips 300 and 400 are vertically stacked to provide the sub-stack structure 100, electrical paths coupled to the first and second semiconductor chips 300 and 400 may be comprised of the first to fourth redistribution line structures 510, 530, 550, and 570 and the first and second side connectors 610 and 620. Accordingly, the electrical paths of the sub-stack structure 100 including the first and second semiconductor chips 300 and 400 vertically stacked may be realized using the first to fourth redistribution line structures 510, 530, 550, and 570 as well as the first and second side connectors 610 and 620 even without using through silicon vias (TSVs).

Referring again to FIGS. 1 and 2, the chip stack package 10 may further include a package substrate 800 which are coupled to the first and second connectors 710 and 730. The package substrate 800 may correspond to an interconnection structure that electrically connects the sub-stack structure 100 to an external device or an external system. The package substrate 800 may be a printed circuit board (PCB) including interconnection structures. The package substrate 800 may be an interposer including interconnection structures.

The first and second connectors 710 and 730 may be bonded to first joint portions 810 disposed on a surface of the package substrate 800. The first and second connectors 710 and 730 may be bonded to the first joint portions 810 by a conductive adhesive layer 910. The first joint portions 810 may be conductive pads. The conductive adhesive layer 910 may include a solder layer. Second joint portions 820 may be disposed on another surface of the package substrate 800 opposite to the sub-stack structure 100. Outer connectors 930 may be attached to the second joint portions 820, respectively. The outer connectors 930 may be connection members such as solder balls. An encapsulant layer (not illustrated) may be additionally disposed on the package substrate 800 to cover the sub-stack structure 100. The encapsulant layer may include a dielectric material or an epoxy molding compound (EMC) material.

Referring to FIG. 3, the chip stack package 10 may further include first dummy connectors 790 disposed to be spaced apart from the first and second connectors 710 and 730. The first dummy connectors 790 may be disposed on the first surface 301 of the first semiconductor chip 300. The first dummy connectors 790 may be bonded to first dummy pads 590 disposed on the first surface 301 of the first semiconductor chip 300. The first dummy connectors 790 may be used to bond the first semiconductor chip 300 to the package substrate 800 together with the first and second connectors 710 and 730. The first dummy connectors 790 may be disposed to support the first semiconductor chip 300 of the sub-stack structure 100 and to help the first semiconductor chip 300 keep its balance when the sub-stack structure 100 is mounted on the package substrate 800. Second dummy connectors 790-1 may be disposed on the third surface 401 of the second semiconductor chip 400. The second dummy connectors 790-1 may be bonded to second dummy pads 595 disposed on the third surface 401 of the second semiconductor chip 400.

Referring to FIGS. 3 and 4, the first dummy pads 590 to which the first dummy connectors 790 are bonded may be disposed on the first surface 301 of the first semiconductor chip 300. The first dummy pads 590 may be disposed to be laterally spaced apart from the first and second redistribution line structures 510 and 530, as illustrated in FIG. 4. The first dummy pads 590 may be electrically insulated from the first and second redistribution line structures 510 and 530.

Referring to FIGS. 3 and 5, the second dummy pads 595 may be disposed on the third surface 401 of the second semiconductor chip 400. The second dummy connectors 790-1 disposed on the third surface 401 of the second semiconductor chip 400 may be bonded to the second dummy pads 595 which are spaced apart from the third and fourth redistribution line structures 550 and 570, as illustrated in FIG. 5.

Figure 7:
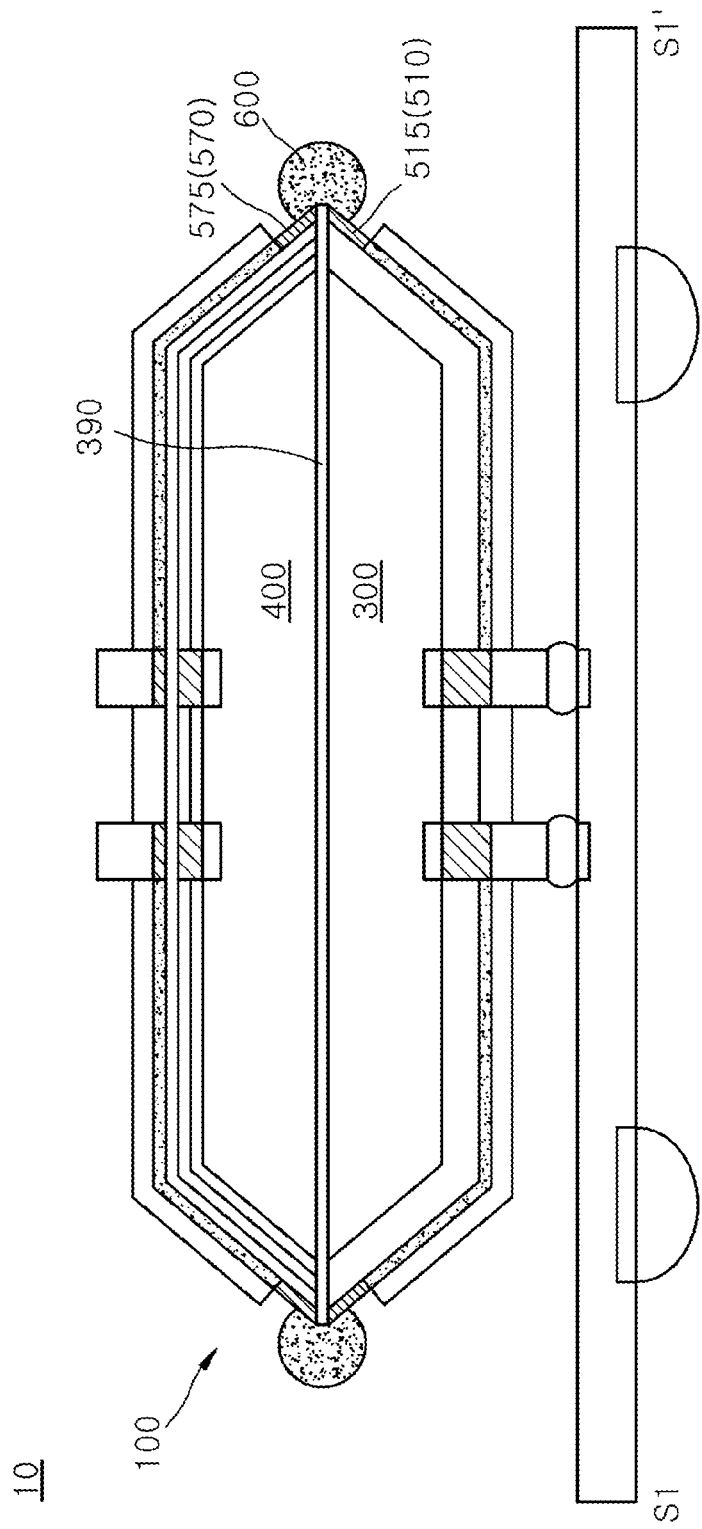
FIGS. 7 and 8 are cross-sectional views illustrating a method of connecting redistribution line structures employed in a chip stack package according to an embodiment.
Figure 8:
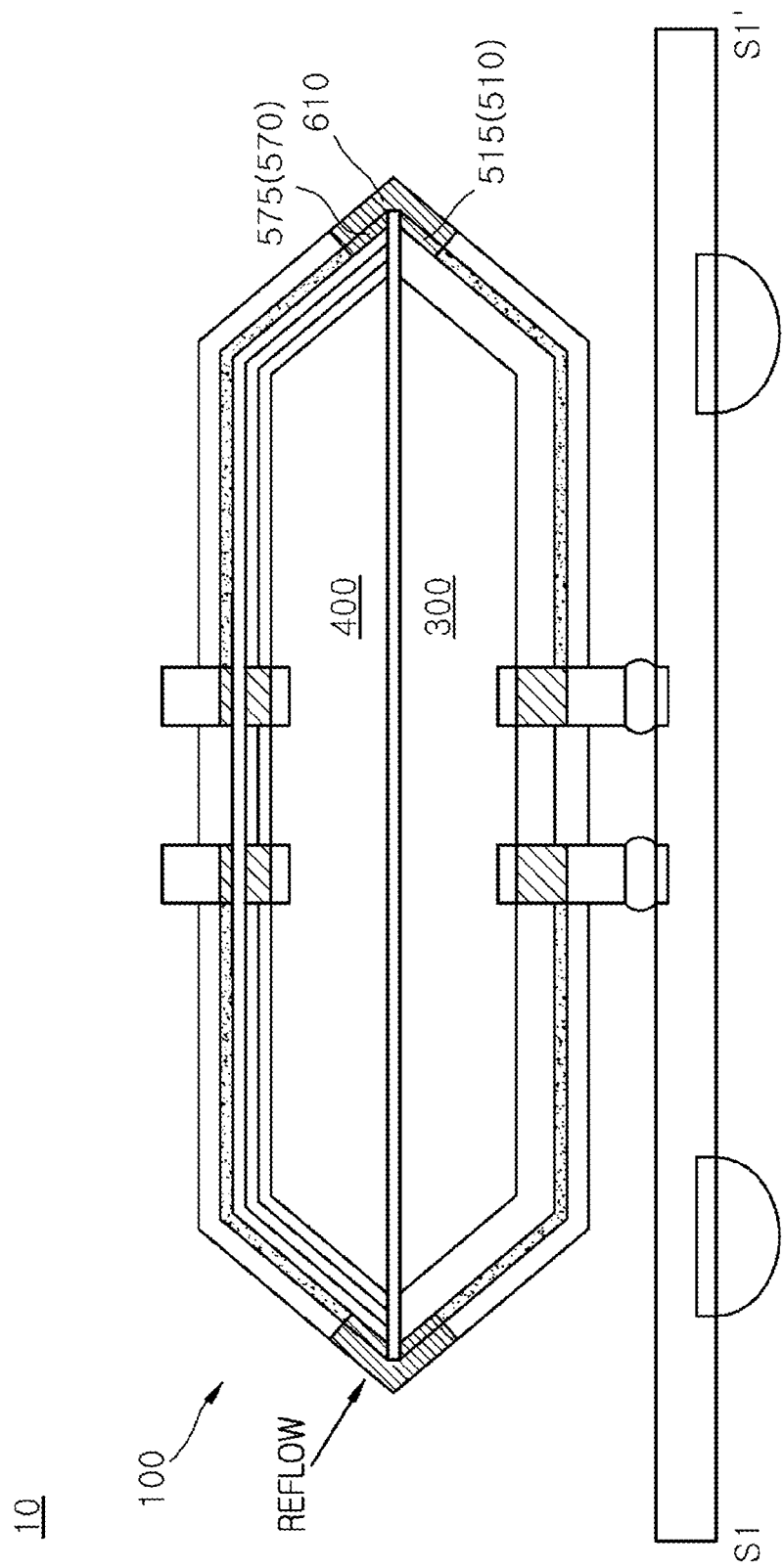

FIGS. 7 and 8 are cross-sectional views illustrating a method of connecting the redistribution line structures 510 and 570 employed in the chip stack package 10 according to an embodiment.

Referring to FIG. 7, after the second semiconductor chip 400 is bonded to the first semiconductor chip 300 by the adhesive layer 390 to provide the sub-stack structure 100, solder dots 600 for forming the first side connectors (610 of FIG. 1) may be attached to the sub-stack structure 100. The solder dots 600 may be attached to portions where the end portions 515 of the first redistribution line structures 510 and the end portions 575 of the fourth redistribution line structures 570 are located.

Referring to FIG. 8, the solder dots 600 may be heated up to induce the reflow of the solder dots 600. The solder dots 600 may be heated up to a high temperature over a melting point of a solder material included in the solder dots 600 in order to induce the reflow of the solder dots 600. As the solder dots 600 reflow, the solder dots 600 may be spread out to cover the end portions 515 of the first redistribution line structures 510 and the end portions 575 of the fourth redistribution line structures 570. As a result, the solder dots 600 may be deformed to provide the first side connectors 610 that cover the end portions 515 of the first redistribution line structures 510 and the end portions 575 of the fourth redistribution line structures 570.

Figure 9:
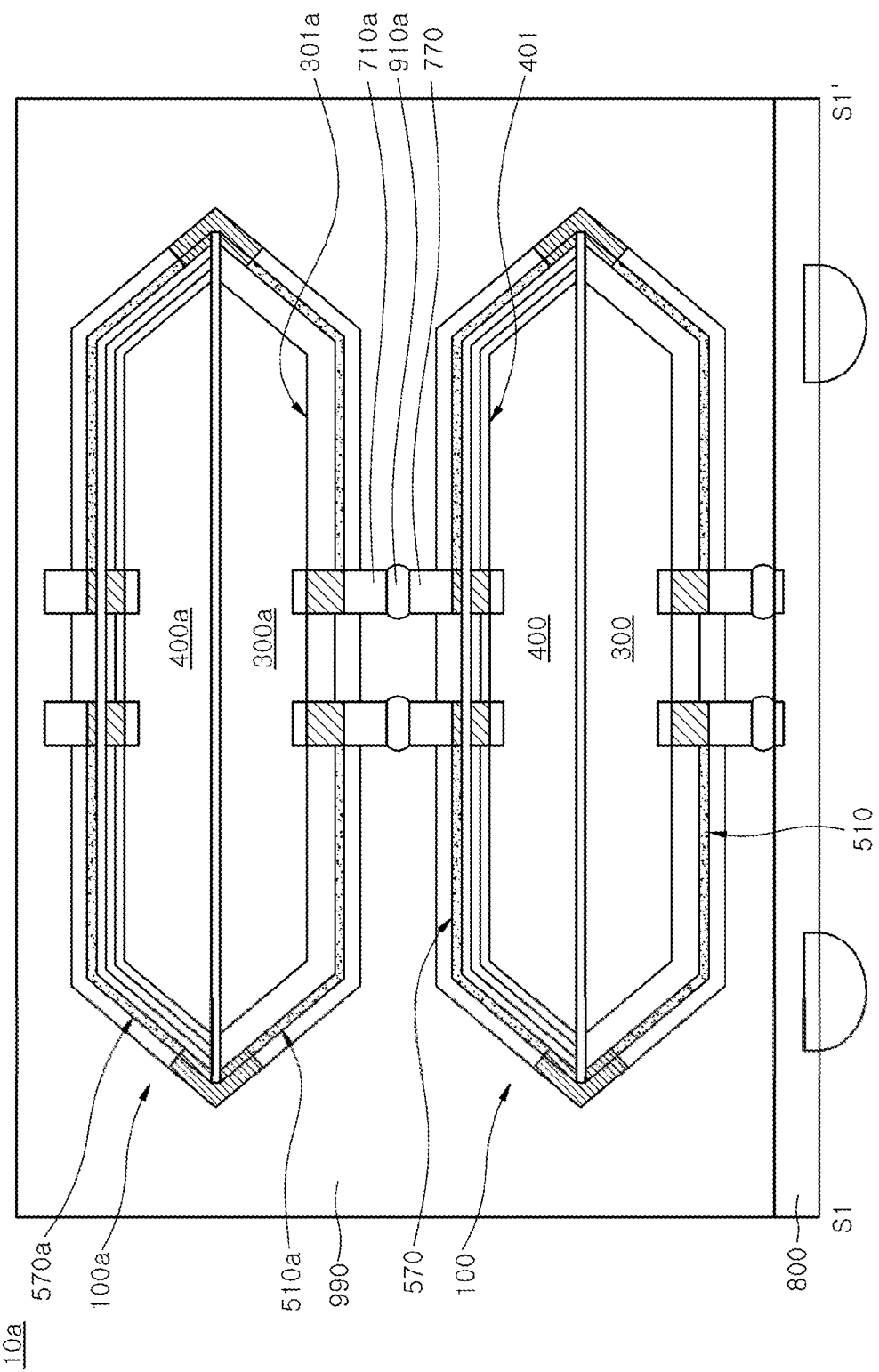
FIGS. 9 and 10 are cross-sectional views illustrating a chip stack package according to an embodiment.
Figure 10:
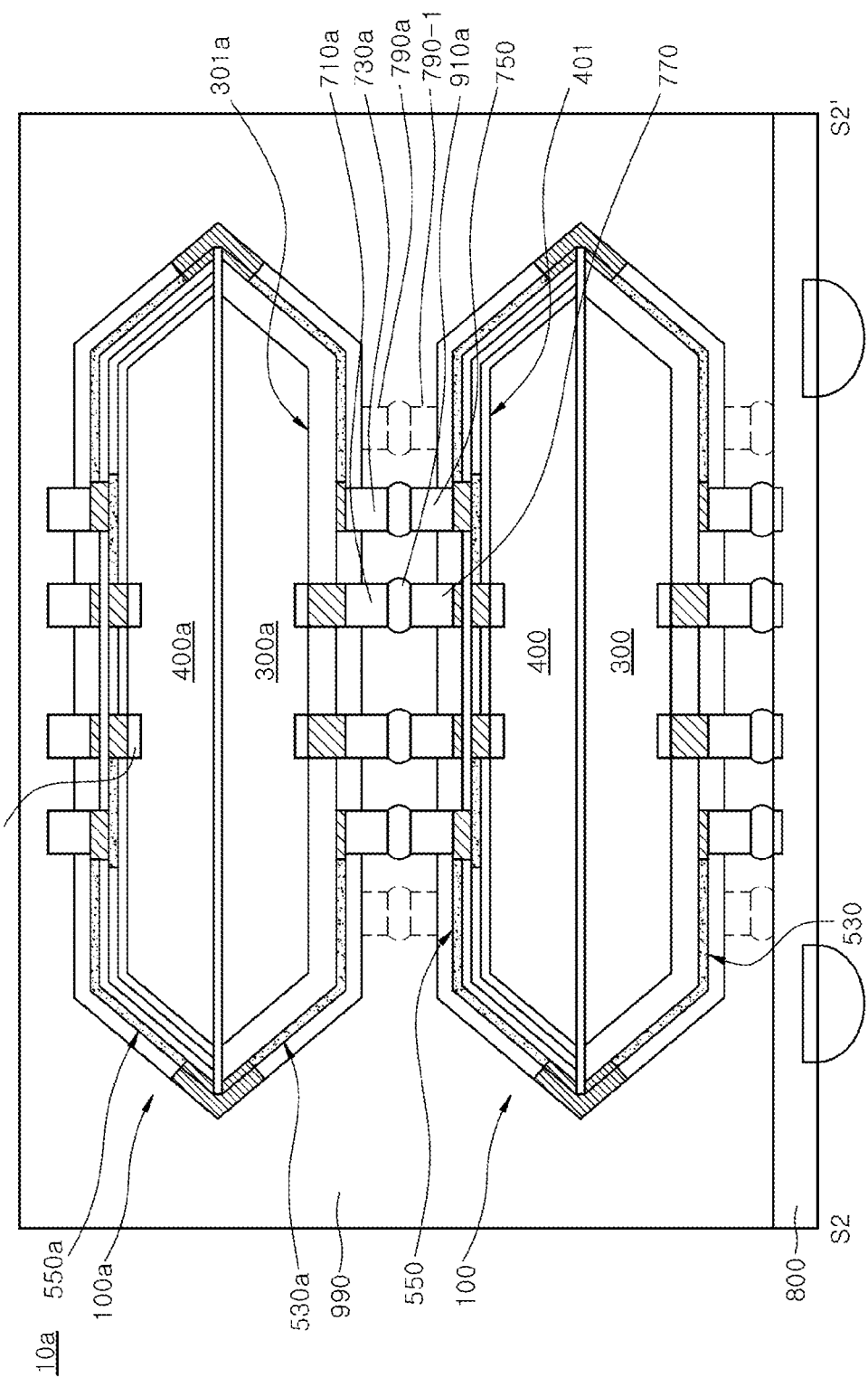

FIGS. 9 and 10 are cross-sectional views illustrating a chip stack package 10a according to an embodiment.

Referring to FIGS. 9 and 10, the chip stack package 10a may include a first sub-stack structure 100 and a second sub-stack structure 100a which are vertically stacked on the package substrate 800. The first sub-stack structure 100 may have substantially the same configuration as the sub-stack structure 100 described with reference to FIGS. 1 and 2. The second sub-stack structure 100a may also have substantially the same configuration as the sub-stack structure 100 described with reference to FIGS. 1 and 2. Accordingly, the first and second sub-stack structures 100 and 100a may be provided to have the same structure. A first semiconductor chip 300a and a second semiconductor chip 400a included in the second sub-stack structure 100a may be the same chips as the first semiconductor chip 300 and the second semiconductor chip 400 included in the first sub-stack structure 100, respectively.

The second sub-stack structure 100a may be stacked on the first sub-stack structure 100 such that a first surface 301a of the first semiconductor chip 300a in the second sub-stack structure 100a faces the third surface 401 of the second semiconductor chip 400 in the first sub-stack structure 100. The third connectors 750 of the first sub-stack structure 100 may be bonded to second connectors 730a of the second sub-stack structure 100a by a conductive adhesive layer 910a, respectively. The fourth connectors 770 of the first sub-stack structure 100 may be bonded to first connectors 710a of the second sub-stack structure 100a by the conductive adhesive layer 910a, respectively. The second dummy connectors 790-1 of the first sub-stack structure 100 may also be bonded to first dummy connectors 790a of the second sub-stack structure 100a, respectively.

The first redistribution line structures 510, the fourth redistribution line structures 570, and the fourth connectors 770 of the first sub-stack structure 100 as well as the first connectors 710a of the second sub-stack structure 100a may constitute electrical paths. These electrical paths may electrically connect the first semiconductor chip 300 of the first sub-stack structure 100 to the first semiconductor chip 300a of the second sub-stack structure 100a. In addition, the electrical paths may electrically connect the first semiconductor chip 300a of the second sub-stack structure 100a to the package substrate 800. In an embodiment, the first redistribution line structures 510, the fourth redistribution line structures 570, and the fourth connectors 770 of the first sub-stack structure 100 as well as the first connectors 710a, first redistribution line structures 510a, and fourth redistribution line structures 570a of the second sub-stack structure 100a may also constitute electrical paths.

The second redistribution line structures 530, the third redistribution line structures 550, and the third connectors 750 of the first sub-stack structure 100 as well as the second connectors 730a, second redistribution line structures 530a, third redistribution line structures 550a, and second chip pads 410a of the second sub-stack structure 100a may constitute other electrical paths. These other electrical paths may electrically connect the second semiconductor chip 400 of the first sub-stack structure 100 to the second semiconductor chip 400a of the second sub-stack structure 100a. In addition, the other electrical paths may electrically connect the second semiconductor chip 400 of the first sub-stack structure 100 to the package substrate 800.

Although FIGS. 9 and 10 illustrate an example in which the first and second sub-stack structures 100 and 100a are stacked on the package substrate 800, the present disclosure is not limited thereto. For example, in some other embodiments, a single third semiconductor chip instead of the second sub-stack structure 100a may be coupled to the third and fourth connectors 750 and 770 of the first sub-stack structure 100. In such a case, the single third semiconductor chip may have substantially the same configuration as the first semiconductor chip 300a of the second sub-stack structure 100a. In yet some other embodiments, at least one sub-stack structure may be additionally stacked on the second sub-stack structure 100a.

Referring again to FIGS. 9 and 10, an encapsulant layer 990 may be disposed on the package substrate 800 to cover the first and second sub-stack structures 100 and 100a.

Figure 11:
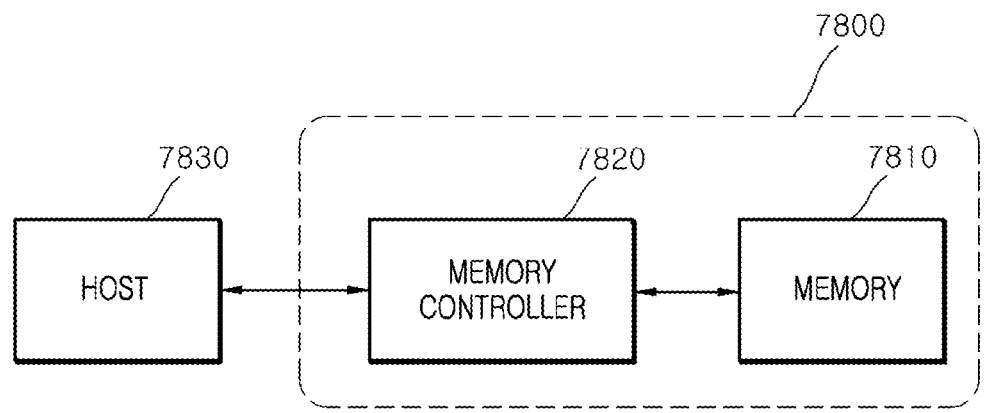
FIG. 11 is a block diagram illustrating an electronic system employing a memory card including a package according to an embodiment.

FIG. 11 is a block diagram illustrating an electronic system including a memory card 7800 employing the semiconductor package according to an embodiment. The memory card 7800 may include a memory 7810 such as a nonvolatile memory device, and a memory controller 7820. The memory 7810 and the memory controller 7820 may store data or read out the stored data. At least one of the memory 7810 and the memory controller 7820 may include at least one chip stack package according to embodiments of the present disclosure.

The memory 7810 may include a nonvolatile memory device fabricated according to embodiments of the present disclosure. The memory controller 7820 may control the memory 7810 such that stored data is read out or data is stored in response to a read/write request from a host 7830.

Figure 12:
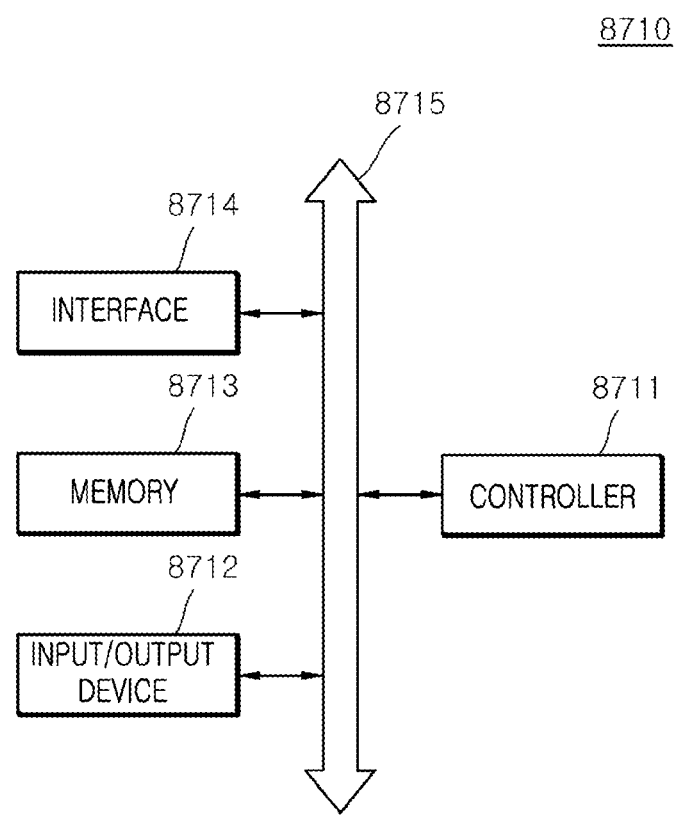
FIG. 12 is a block diagram illustrating another electronic system including a package according to an embodiment.

FIG. 12 is a block diagram illustrating an electronic system 8710 including at least one package according to embodiments of the present disclosure. The electronic system 8710 may include a controller 8711, an input/output device 8712, and a memory 8713. The controller 8711, the input/output device 8712, and the memory 8713 may be coupled with one another through a bus 8715 providing a path through which data move.

In an embodiment, the controller 8711 may include one or more microprocessor, digital signal processor, microcontroller, and/or logic device capable of performing the same functions as these components. The controller 8711 or the memory 8713 may include one or more packages according to embodiments of the present disclosure. The input/output device 8712 may include at least one selected among a keypad, a keyboard, a display device, a touchscreen, and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer, or a logic system performing various functions. For example, the mobile system may be any one of a personal digital assistant (PDA), a portable computer, a tablet computer, a mobile phone, a smart phone, a wireless phone, a laptop computer, a memory card, a digital music system, an information transmission/reception system, etc.

If the electronic system 8710 is an equipment capable of performing wireless communication, the electronic system 8710 may be used in a communication system using a technique of CDMA (code division multiple access), GSM (global system for mobile communications), NADC (North American digital cellular), E-TDMA (enhanced-time division multiple access), WCDMA (wideband code division multiple access), CDMA2000, LTE (long term evolution) or WiBro (wireless broadband Internet).

Embodiments of the present disclosure have been disclosed for illustrative purposes. Those skilled in the art will appreciate that various modifications, additions, and substitutions are possible without departing from the scope and spirit of the present disclosure and the accompanying claims.

What is claimed is:

1. A chip stack package comprising:
a first semiconductor chip configured to have a first surface and a second surface being opposite to each other and configured to have a first side surface connecting edges of the first surface to edges of the second surface;
a second semiconductor chip configured to have a third surface and a fourth surface being opposite to each other and configured to have a second side surface connecting edges of the third surface to edges of the fourth surface, wherein the second semiconductor chip is stacked on the second surface of the first semiconductor chip;
a first redistribution line structure configured to be disposed on the first surface to be electrically connected to the first semiconductor chip and configured to extend onto the first side surface;
a second redistribution line structure configured to be disposed on the first surface to electrically bypass the first semiconductor chip and configured to extend onto the first side surface; and
a third redistribution line structure configured to be disposed on the third surface to be electrically connected to the second semiconductor chip and configured to extend onto the second side surface to be electrically connected to the second redistribution line structure.

2. The chip stack package of claim 1,
wherein the first semiconductor chip further includes first chip pads disposed on the first surface;
wherein the second semiconductor chip further includes second chip pads disposed on the third surface; and
wherein the second semiconductor chip is stacked on the first semiconductor chip such that the fourth surface faces the second surface.

3. The chip stack package of claim 2, further comprising an adhesive layer that bonds the fourth surface to the second surface.

4. The chip stack package of claim 2, wherein the first redistribution line structure includes:
a first landing portion overlapping with and being in contact with any one of the first chip pads; and
a first extending portion extending from the first landing portion onto the first side surface.

5. The chip stack package of claim 4, wherein the second redistribution line structure includes:
a second landing portion spaced apart from the first landing portion to electrically bypass the first semiconductor chip; and
a second extending portion extending from the second landing portion onto the first side surface.

6. The chip stack package of claim 5, wherein the third redistribution line structure includes:

a third landing portion overlapping with and being in contact with any one of the second chip pads; and a fourth landing portion spaced apart from the third landing portion;

an interconnecting portion extending from the fourth landing portion to the third landing portion to electrically connect the fourth landing portion to the third landing portion; and a third extending portion extending from the fourth landing portion onto the second side surface.

7. The chip stack package of claim 6, further comprising a fourth redistribution line structure disposed on the second semiconductor chip, wherein the fourth redistribution line structure includes:

a fifth landing portion vertically stacked on the third landing portion to substantially overlap with the third landing portion and to electrically bypass the second semiconductor chip; and a fourth extending portion extending from the fifth landing portion onto the second side surface.

8. The chip stack package of claim 7, further comprising a dielectric layer disposed between the third landing portion and the fifth landing portion, wherein the dielectric layer extends to cover the third landing portion and the interconnecting portion.

9. The chip stack package of claim 7, wherein the third landing portion and the interconnecting portion are located at a different level from the fifth landing portion, the fourth extending portion, the fourth landing portion, and the third extending portion.

10. The chip stack package of claim 7, further comprising a first side connector that is disposed on the first and second side surfaces to cover both of an end portion of the fourth extending portion and an end portion of the first extending portion.

11. The chip stack package of claim 10, further comprising a second side connector that is disposed on the first and second side surfaces to cover both of an end portion of the third extending portion and an end portion of the second extending portion.

12. The chip stack package of claim 11, wherein the second side connector includes a solder material.

13. The chip stack package of claim 7, further comprising:

a first connector attached to the first landing portion to be electrically connected to the first semiconductor chip;

a second connector attached to the second landing portion to electrically bypass the first semiconductor chip;

a third connector attached to the fourth landing portion to be electrically connected to the second semiconductor chip; and a fourth connector attached to the fifth landing portion to electrically bypass the second semiconductor chip and to be electrically connected to the first semiconductor chip.

14. The chip stack package of claim 13, further comprising dummy connectors disposed to be spaced apart from the first and second connectors.

15. The chip stack package of claim 13, further comprising a package substrate coupled to the first and second connectors.

16. The chip stack package of claim 13, further comprising a third semiconductor chip coupled to the third and fourth connectors.

17. The chip stack package of claim 1, wherein the first side surface is an inclined surface having a positive slope.

18. The chip stack package of claim 1, wherein a length of the second surface between the edges of the second surface is different than a length of the first surface between the edges of the first surface.

19. A chip stack package comprising:

a pair of sub-stack structures which are vertically stacked, wherein each of the pair of sub-stack structures includes:

a first semiconductor chip having a first surface and a second surface being opposite to each other and having a first side surface connecting edges of the first surface to edges of the second surface;

a second semiconductor chip having a third surface and a fourth surface being opposite to each other and having a second side surface connecting edges of the third surface to edges of the fourth surface, wherein the second semiconductor chip is stacked on the second surface of the first semiconductor chip;

a first redistribution line structure disposed on the first surface to be electrically connected to the first semiconductor chip and to extend onto the first side surface;

a second redistribution line structure disposed on the first surface to electrically bypass the first semiconductor chip and to extend onto the first side surface;

a third redistribution line structure disposed on the third surface to be electrically connected to the second semiconductor chip and extending onto the second side surface to be electrically connected to the second redistribution line structure; and a fourth redistribution line structure disposed on the third surface to electrically bypass the second semiconductor chip and extending onto the second side surface to be electrically connected to the first redistribution line structure, and wherein the pair of sub-stack structures are vertically stacked such that the third surface of the second semiconductor chip included in one of the pair of sub-stack structures faces the first surface of the first semiconductor chip included in the other of the pair of sub-stack structures.

20. The chip stack package of claim 19, wherein the one of the pair of sub-stack structures corresponds to a first sub-stack structure;

wherein the other of the pair of sub-stack structures corresponds to a second sub-stack structure;

wherein the fourth redistribution line structure of the first sub-stack structure is electrically connected to the first redistribution line structure of the second sub-stack structure; and wherein the third redistribution line structure of the first sub-stack structure is electrically connected to the second redistribution line structure of the second sub-stack structure.

* * * * *